United States Patent [19]
Ramsbey et al.

[11] Patent Number: 5,981,364
[45] Date of Patent: *Nov. 9, 1999

[54] METHOD OF FORMING A SILICON GATE TO PRODUCE SILICON DEVICES WITH IMPROVED PERFORMANCE

[75] Inventors: Mark T. Ramsbey, Sunnyvale; Hsingya Arthur Wang; Yu Sun, both of Saratoga, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/568,195

[22] Filed: Dec. 6, 1995

[51] Int. Cl.⁶ .................................................. H01L 21/28
[52] U.S. Cl. .......................... 438/592; 438/595; 438/197
[58] Field of Search ................... 438/585, 592, 438/197, 595, FOR 349, FOR 351, FOR 353

[56] References Cited

U.S. PATENT DOCUMENTS

| | | | |
|---|---|---|---|
| 4,249,968 | 2/1981 | Gardiner et al. | 438/592 |
| 4,558,338 | 12/1985 | Sakata | 438/592 |
| 4,584,760 | 4/1986 | Okazawa | 438/592 |
| 4,914,046 | 4/1990 | Tobin et al. | 438/592 |
| 5,147,820 | 9/1992 | Chittipeddi et al. | |
| 5,256,894 | 10/1993 | Shino | 438/592 |
| 5,350,698 | 9/1994 | Huang et al. | |
| 5,438,007 | 8/1995 | Vinal et al. | 438/592 |
| 5,441,904 | 8/1995 | Kim et al. | |
| 5,444,302 | 8/1995 | Nakajima et al. | 438/592 |
| 5,464,789 | 11/1995 | Saito | 438/592 |
| 5,512,502 | 4/1996 | Ootsuka et al. | 438/592 |
| 5,567,638 | 10/1996 | Lin et al. | 438/592 |
| 5,614,428 | 3/1997 | Kapoor | 438/592 |
| 5,641,708 | 6/1997 | Sardella et al. | 438/592 |
| 5,652,156 | 7/1997 | Liao et al. | |
| 5,712,181 | 1/1998 | Byun et al. | |
| 5,767,004 | 6/1998 | Balasubramanian et al. | 438/592 |
| 5,877,074 | 3/1999 | Jeng et al. | 438/502 |
| 5,879,975 | 3/1999 | Karlsson et al. | 438/162 |
| 5,882,994 | 3/1999 | Araki et al. | 438/503 |

*Primary Examiner*—Mary Wilczewski
*Attorney, Agent, or Firm*—Sawyer & Associates

[57] ABSTRACT

Disclosed herein is a method of forming a silicon gate stack onto a silicon substrate for a silicon device. The method of forming the silicon gate stack comprises the steps of growing an oxide layer onto the silicon substrate, depositing a thin layer of silicon to form a thin layer of silicon over the oxide layer, depositing a thick layer of silicon over the thin layer of silicon, and introducing impurities into only the thick layer of silicon to form a silicon gate whereby the silicon gate includes the thin layer of silicon and the thick layer of silicon having the impurities. The impurities being introduced with a concentration, the impurities concentration and the thick layer thickness impeding an encroachment by the oxide layer into the silicon gate during application of a protective screen oxide layer around the silicon gate stack.

8 Claims, 8 Drawing Sheets

METHOD OF FORMING A SILICON GATE TO PRODUCE SILICON DEVICES WITH IMPROVED PERFORMANCE

BACKGROUND OF THE INVENTION

1. Field of the Invention

The present invention relates to fabricating semiconductor devices and more particularly to forming high quality oxide layers for semiconductor devices.

2. Description of Previous Art

As advances in processing technology allow ever increasing number of integrated devices to be fabricated on a single integrated circuit (IC), fabricating these integrated devices with consistent electrical properties is a constant struggle. Strict guidelines and tight tolerances are setup for fabricating facilities in efforts to produce integrated devices with reproducible electrical properties. However, even with the strict guidelines and the tight tolerances, there are still many problems with the processing technologies that are currently in use.

For example, when a metal oxide silicon (MOS) transistor is fabricated, the gate of the transistor is first formed on the silicon substrate. Once the gate is formed, the source and the drain of the MOS transistor are formed. In forming the gate of the MOS transistor, a gate oxide is first grown over the silicon substrate. Next, a gate layer is formed over the gate oxide. A screen oxide is applied over the areas surrounding the gate oxide and the gate to protect the gate stack of the MOS transistor from later processing in the formation of the source and drain. One problem that is prevalent when applying the screen oxide to the gate stack of the MOS transistor is thickening of the gate oxide.

Thickening of the gate oxide occurs at the stack edges of the MOS transistor. The thickened gate oxide encroaches the gate layer by oxidizing portions of the gate. In fabricating single gate MOS transistors, thickening of the gate oxide cause variations in threshold voltages and drive current when slight variations in gate length and processing conditions occur. These slight variations in gate length and processing often occur during fabrication. Threshold voltage and drive current variations cause the MOS transistors to have inconsistent activation voltages. Thus, the electrical properties of these MOS transistors fluctuate and are inconsistent with each other.

In fabricating multiple gate transistors such as electrically erasable programmable read only memories (EEPROM's) having a floating gate and a control gate, the thickening of the gate oxide has the undesirable effect of reducing the coupling between the floating gate and the control gate which can cause programming and erasing errors. Other undesirable effects include increasing the barrier to tunneling or hot carrier injection between the source/channel/drain regions and the floating gate. Given that program and erase operations of EEPROM's rely on carriers passing through a tunnel oxide so that the carriers can either be trapped or removed, the effects of thickening the tunneling oxide increase program and erase operations. Additionally, without a uniformly formed tunneling oxide, the reliability of the EEPROM's will suffer. Tunnel oxide breakdown will occur more often causing the EEPROM's to fail. The thickening of the tunneling oxide also changes with slight variations in gate lengths and processing conditions that often occur during processing of the nonvolatile memory transistors.

The effects of the thickening oxide are even more pronounced and becomes proportionally greater as the gate lengths of the MOS transistors are scaled smaller. As current advances in processing technology allow ever increasing number of smaller scaled integrated devices to be fabricated on a single IC, the problem of thickening oxide becomes more apparent. A high quality oxide layer of uniform thickness is important if the MOS transistors are to be scaled smaller.

Therefore, it is desirable to provide a method of forming a high quality oxide layer for silicon gates to produce MOS devices that possesses more consistent electrical properties and is less sensitive to process variations for better performing and more reliably operating MOS circuits.

SUMMARY OF THE INVENTION

It is an object of this invention to provide a high quality oxide layer and gate interface for a semiconductor device.

It is an additional object of this invention to provide more consistent performing semiconductor devices.

It is an additional object of this invention to provide semiconductor devices that are less sensitive to processing conditions.

In accordance with the above objects and those that will be mentioned and will become apparent below, the method of forming a silicon gate stack onto a silicon substrate for a silicon device in accordance with this invention comprises the steps of:

growing an oxide layer onto the silicon substrate;

depositing a thin layer of silicon to form a thin layer of silicon over the oxide layer;

depositing a thick layer of silicon over the thin layer of silicon; and introducing impurities into only the thick layer of silicon to form a silicon gate whereby the silicon gate includes the thin layer of silicon and the thick layer of silicon having the impurities. The impurities being introduced with a concentration, the impurities concentration and the thick layer thickness impeding an encroachment by the oxide layer into the silicon gate during application of a protective screen oxide layer around the silicon gate stack.

According to one aspect of the invention, the method further comprises the step of forming a protective screen oxide layer around the silicon gate. The protective screen layer protects the gate stack from damage that can result from later processing.

According to another aspect of the invention, the layers of silicon comprises of polysilicon. The layers of silicon may also be comprised of amorphous silicon. The oxide layer is comprised of silicon oxide.

According to yet another aspect of the invention, the step of introducing impurities includes doping the thick layer of silicon with nitrogen. Thus, the thick layer of silicon is nitrogen in-situ doped.

The method of forming a silicon gate stack onto a silicon substrate for a silicon device is provided. The impurities doped thick layer of silicon reduces thickening of the oxide layer that occurs from the application of the screen oxide layer. By reducing the thickening of the oxide layer, a high quality oxide layer of uniform thickness is achieved. The high quality oxide layer of uniform thickness provides a superior interface with consistent electrical properties between the gate oxide and the silicon gate. Thus, semiconductor devices fabricated using the high quality oxide layer provide more consistent and reliable performance. The semiconductor devices formed using the high quality oxide layer are also less sensitive to processing conditions that can alter electrical properties of the devices.

It is an advantage of this invention to a provide a high quality oxide layer and gate interface for a semiconductor device.

It is an additional advantage of this invention to provide more consistent performing semiconductor devices.

It is an additional advantage of this invention to provide semiconductor devices that are less sensitive to processing conditions.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 1:
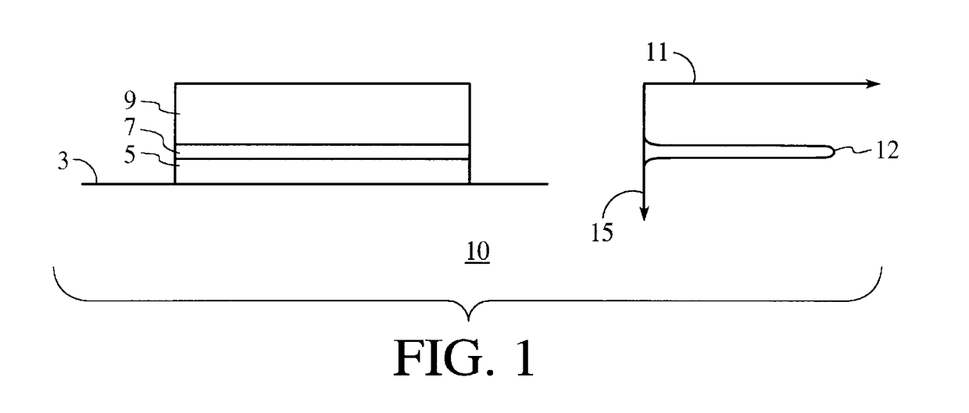
FIG. 1 is a diagram of a gate structure and an accompanying graph showing nitrogen impurity concentration of the processing chamber during fabrication of the gate structure according to an embodiment of the present invention.

A detailed description of preferred embodiments of the present invention is provided with respect to the drawings. Like characters refer to like elements throughout. FIG. 1 depicts a simplified gate structure 10 for a silicon device such as a complementary metal oxide silicon (CMOS) device. The simplified gate structure 10 includes a silicon substrate 3, a thin gate oxide 5, and a gate comprising of gate layers 7 and 9. FIG. 1 also depicts a graph having an x-axis 11 and an y-axis 15. X-axis 11 represents impurity concentration during fabrication of the gate structure 10, and the y-axis represents the vertical location of the gate structure 10 with respect to the thin gate oxide 5 and the gate layers 7 and 9. The graph illustrates the impurities being introduced with a concentration to the layer being doped.

Referring to FIG. 1, the gate structure 10 is formed on the silicon substrate 3. The first layer of the gate structure 10 is the gate oxide layer 5. The gate oxide layer 5 is formed by growing an oxide layer onto the silicon substrate 3. A thin gate layer 7 is formed by growing a layer of polysilicon, amorphous silicon, or other similar material over the gate oxide layer 5. As the thin gate layer 7 is formed, impurities are introduced into the processing chamber. Impurities such as carbon or nitrogen may be used. In the preferred embodiment, nitrogen impurities are introduced to the processing chamber during the formation of thin gate layer 7. Specifically, the nitrogen impurities are introduced in the form of ammonia gas, $NH_3$. Curve 12 represents the concentration of $NH_3$ in the processing chamber as the thin gate layer 7 is formed. The nitrogen impurities may also be implanted during the formation of the thin gate layer 7. Thus, the thin gate layer 7 is nitrogen in-situ doped. The thin gate layer 7 may be as thin as one crystalline layer. The thick gate layer 9 is formed after the formation of the thin gate layer 7. The thick gate layer 9 is formed by growing a layer of polysilicon, amorphous silicon, or other similar material in the absence of nitrogen impurities. As curve 12 shows, nitrogen impurities in the form of $NH_3$ are not introduced to the processing chamber during the formation of the thick gate layer 9.

Figure 2:
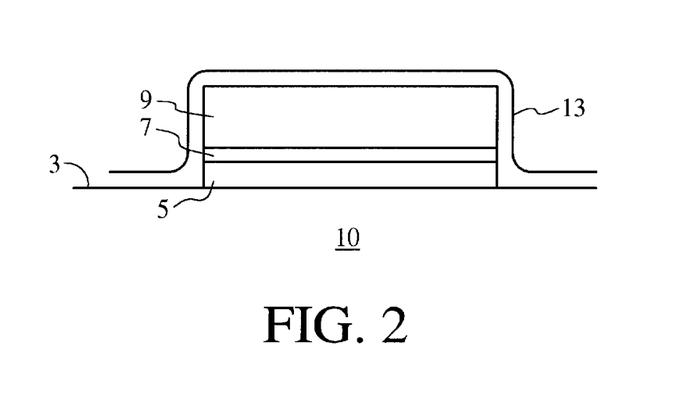
FIG. 2 is a diagram of the gate structure having a protective screen oxide in accordance with the invention.

FIG. 2 depicts the gate structure 10 with a protective screen oxide 13. The screen oxide 13 surrounds areas of the silicon substrate 3, the gate oxide layer 5, the thin gate layer 7, and the thick gate layer 9. The screen oxide 13 protects the gate structure 10 and the surrounding areas of the gate structure 10 from impurities and damage caused by subsequent ion implantation and other processes. These processes include formation of the source and drain for the gate structure 10. The thin gate layer 7 reduces thickening of the gate oxide layer 5 that occurs proximate to the interface edge of the gate oxide layer 5, gate layer 7, and the screen oxide 13 during application of the screen oxide 13. Thickening of the gate oxide layer 5 causes variations in threshold voltages and drive current of later CMOS devices that are created from the thickened gate oxide layer 5. Varying the thickness and the concentration of the nitrogen in-situ doped gate layer 7 reduce the encroachment of the gate oxide 5 into the gate layers 7 and 9 caused by oxidation from the application of the screen oxide 13. Thus, a high quality gate oxide layer 5 with uniform thickness is maintained for fabricating consistent and reliable operating CMOS devices. The nitrogen in-situ doped gate layer 7 also has physical properties of reduced grain size that provides more granules for the same gate oxide area which also increases the quality of the gate oxide layer 5. Additionally, forming the gate having a thin gate layer 7 and a thick gate layer 9, oxidation around the perimeter of the thick gate layer 9 and the screen oxide 13 is maintained to provide good sealing between thick gate layer 9 and the screen oxide 13. Good sealing prevents impurities and damage to the gate structure 10 from later processes that reduce the performance and reliability of the later CMOS devices.

Figure 3:
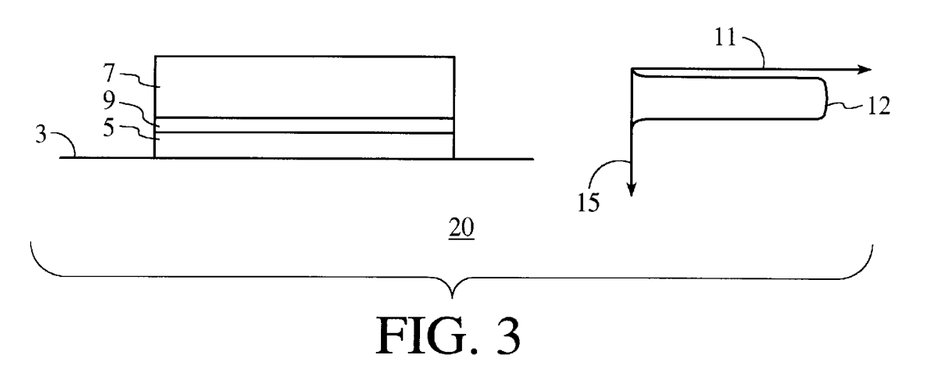
FIG. 3 is a diagram of a gate structure and an accompanying graph showing nitrogen impurity concentration of the processing chamber during fabrication of the gate structure according to an alternative embodiment of the present invention.

In another embodiment of the present invention, FIG. 3 depicts a simplified gate structure 20 for a CMOS device.

The simplified gate structure 20 includes a silicon substrate 3, a thin gate oxide 5, and a gate comprising of gate layers 7 and 9. FIG. 3 also depicts a graph having an x-axis 11 and an y-axis 15. X-axis 11 represents nitrogen concentration during fabrication of the gate structure 20, and the y-axis represents the vertical location of the gate structure 20 with respect to the thin gate oxide 5 and the gate layers 7 and 9. The graph illustrates the impurities being introduced with a concentration to the layer being doped.

The gate structure 20 is formed on the silicon substrate 3. The first layer of the gate structure 20 is the gate oxide layer 5. The gate oxide layer 5 is formed by growing an oxide layer onto the silicon substrate 3. A thin gate layer 9 is formed by growing a layer of polysilicon, amorphous silicon, or other similar material over the gate oxide layer 5. The thick gate layer 7 is grown over the thin gate layer 9. As the thick gate layer 7 is formed, nitrogen impurities in the form of $NH_3$ are introduced into the processing chamber. Other methods of introducing nitrogen impurities to the thick gate layer 7 are also available. For example, nitrogen impurities may be implanted. Curve 12 represents the concentration of $NH_3$ in the processing chamber as the thick gate layer 7 is formed. Thus, the thick gate layer 7 is nitrogen in-situ doped.

Figure 4:
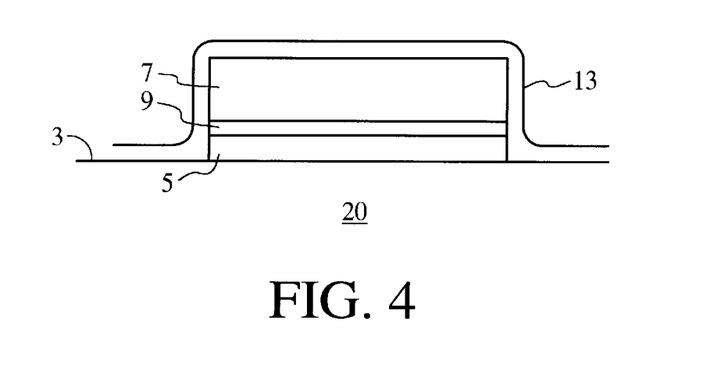
FIG. 4 is a diagram of the gate structure having a protective screen oxide in accordance with the invention.

FIG. 4 depicts the gate structure 20 with a protective screen oxide 13. The screen oxide 13 surrounds areas of the silicon substrate 3, the gate oxide layer 5, the thin gate layer 9, and the thick gate layer 7. The screen oxide 13 protects the gate structure 20 and the surrounding areas of the gate structure 20 from impurities and damage caused by subsequent ion implantation and other processes. These processes include formation of the source and drain for the gate structure 20. The thick gate layer 7 reduces thickening of the gate oxide layer 5 from oxidation that occurs during the application of the screen oxide 13. Thickening of the gate oxide layer 5 causes variations in threshold voltages and drive current of later CMOS devices that are created from the thickened gate oxide layer 5. The thin gate layer 9 provides a gate and gate oxide interface for the gate structure 20 that preserve device characteristics of the polysilicon, amorphous silicon, or other similar material grown in the absence of nitrogen impurities. Thus, a high quality gate and gate oxide interface with reduced gate oxide oxidation are formed for consistent and reliable operating CMOS devices.

Figure 5:
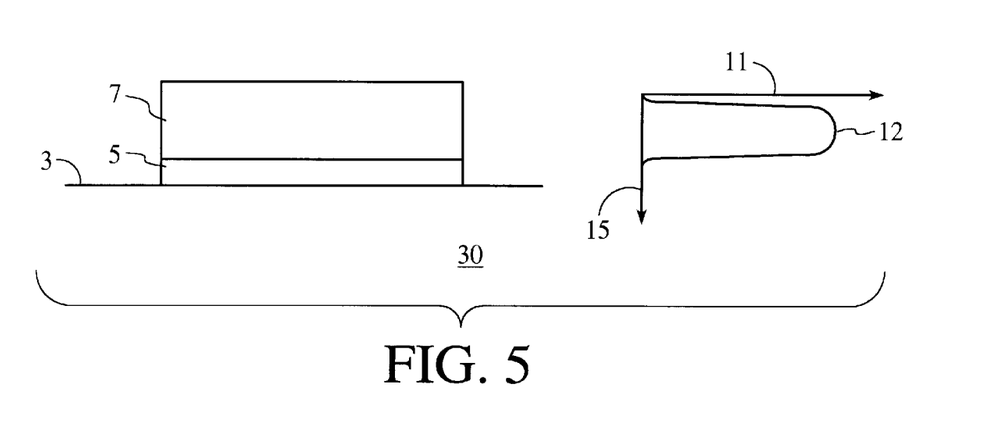
FIG. 5 is a diagram of a gate structure and an accompanying graph showing nitrogen impurity concentration of the processing chamber during fabrication of the gate structure according to an embodiment of the present invention.

In another embodiment of the present invention, FIG. 5 depicts a simplified gate structure 30 for a CMOS device. The simplified gate structure 30 includes a silicon substrate 3, a thin gate oxide 5, and a gate layer 7. FIG. 5 also depicts a graph having an x-axis 11 and an y-axis 15. X-axis 11 represents nitrogen concentration during fabrication of the gate structure 20, and the y-axis represents the vertical location of the gate structure 30 with respect to the thin gate oxide 5 and the gate layer 7. The graph illustrates the impurities being introduced with a concentration to the layer being doped.

The gate structure 30 is formed on the silicon substrate 3. The first layer of the gate structure 30 is the gate oxide layer 5. The gate oxide layer 5 is formed by growing an oxide layer onto the silicon substrate 3. The gate layer 7 is formed by growing a layer of polysilicon, amorphous silicon, or other similar material over the gate oxide layer 5 in the presence of nitrogen impurities. The nitrogen impurities in the form of $NH_3$ are introduced into the processing chamber as the gate layer 7 is formed. The nitrogen impurities may also be implanted during the formation of gate layer 7. Thus, the gate layer 7 is nitrogen in-situ doped. Curve 12 represents the concentration of $NH_3$ in the processing chamber as the gate layer 7 is formed.

Figure 6:
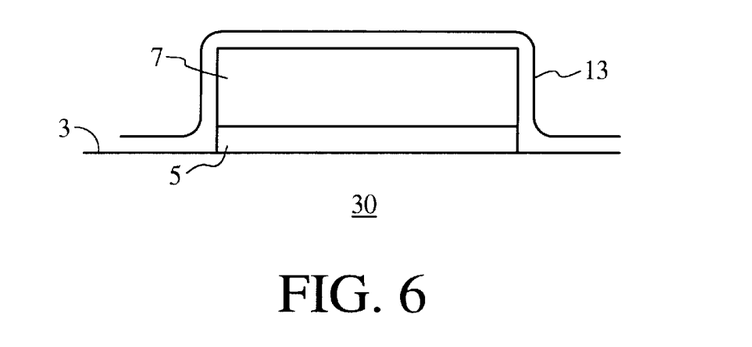
FIG. 6 is a diagram of the gate structure having a protective screen oxide in accordance with the invention.

FIG. 6 depicts the gate structure 30 with a protective screen oxide 13. The screen oxide 13 surrounds areas of the silicon substrate 3, the gate oxide layer 5, and the gate layer 7. The screen oxide 13 protects the gate structure 30 and the surrounding areas of the gate structure 30 from impurities and damage caused by subsequent ion implantation and other processes. These processes include formation of the source and drain for the gate structure 30. The nitrogen in-situ doped gate layer 7 reduces thickening of the gate oxide layer 5 from oxidation of the gate layer 7 that occurs during the application of the screen oxide 13. Thickening of the gate oxide layer 5 causes variations in threshold voltages and drive current of later CMOS devices that are created from the thickened gate oxide layer 5. Thus, a high quality gate and gate oxide interface with reduced gate oxide oxidation are formed for consistent and reliable operating CMOS devices. Additionally, the nitrogen in-situ doped gate layer 7 has physical properties of reduced grain size that provides more granules for the same gate oxide area which also increases the quality of the gate oxide layer 5.

Figure 7:
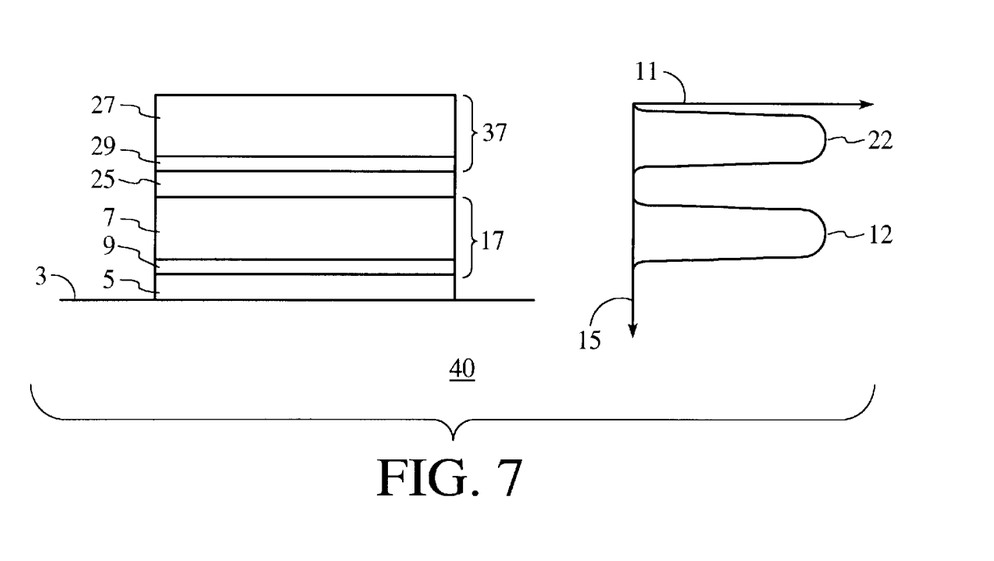
FIG. 7 is an alternative diagram of a gate stack and an accompanying graph showing nitrogen impurity concentration of the processing chamber during fabrication of the gate stack according to an embodiment of the present invention.

In another embodiment of the present invention, FIG. 7 depicts a simplified gate stack 40 for a nonvolatile memory device. The simplified gate stack 40 includes a silicon substrate 3, a tunneling oxide 5, a floating gate 17 comprising of a thin gate layer 9 and a thick gate layer 7, a dielectric layer 25, and a control gate 37 comprising of a thin gate layer 29 and a thick gate layer 27. FIG. 7 also depicts a graph having an x-axis 11 and an y-axis 15. X-axis 11 represents impurity concentration during fabrication of the gate structure 40, and the y-axis represents the vertical location of the gate structure 40 with respect to the thin gate oxide 5, the floating gate layers 7 and 9, the dielectric layer 25, and the control gate layers 27 and 29.

The gate stack 40 is formed on the silicon substrate 3. The first layer of the gate stack 40 is the gate oxide layer 5. The gate oxide layer 5 is formed by growing an oxide layer onto the silicon substrate 3. The thin gate layer 9 is formed by growing a layer of polysilicon, amorphous silicon, or other similar material over the gate oxide layer 5. The thick gate layer 7 is formed while introducing impurities to the processing chamber during the process of growing the thin gate layer 9. Although other impurities such as carbon may be used, the present embodiment introduces nitrogen impurities to the processing chamber. The nitrogen impurities are introduced in the form of $NH_3$ into the processing chamber. Nitrogen impurities may also be implanted during the formation of the thick gate layer 7. Curve 12 represents the concentration of $NH_3$ in the processing chamber as the thick gate layer 7 is formed. Thus, the thick gate layer 7 is nitrogen in-situ doped. Thin gate layer 9 and the thick layer 7 comprise the floating gate of the gate stack 40.

The dielectric layer 25 is grown over the floating gate of gate stack 40. The dielectric layer 25 separates the floating gate 17 and the control gate 37. The control gate 37 comprises of the thin gate layer 29 and the thick gate layer 27. The thin gate layer 29 is formed by growing a layer of polysilicon, amorphous silicon, or other similar material over the gate oxide layer 5. The thick gate layer 27 is formed by introducing impurities to the processing chamber during the process of growing the thin gate layer 29. Although other impurities may be used, the present embodiment introduces nitrogen impurities to the processing chamber. The nitrogen impurities are introduced in the form of $NH_3$ into the processing chamber. The nitrogen impurities may also be implanted to the thick gate layer 27. Thus, the thick gate layer 27 is nitrogen in-situ doped. Curve 22 represents the concentration of $NH_3$ in the processing chamber as the thick gate layer 27 is formed. Thin gate layer 29 and the thick layer 27 comprise the control gate of the gate stack 40.

Figure 8:
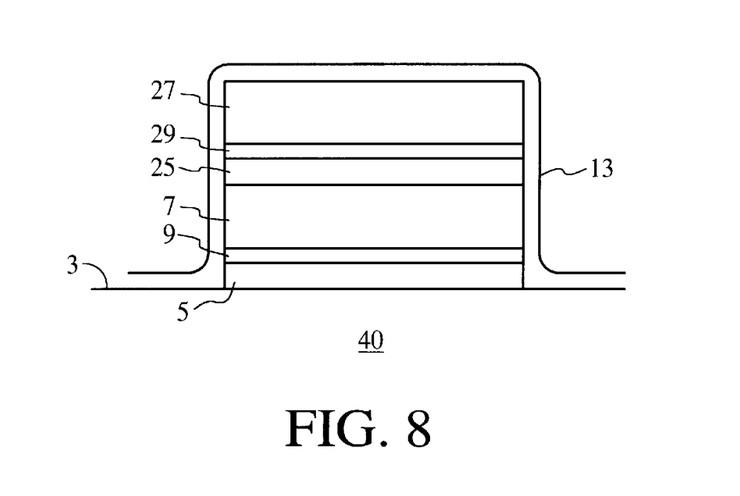
FIG. 8 is a diagram of the gate stack having a protective screen oxide in accordance with the invention.

FIG. 8 depicts the gate stack 40 with a protective screen oxide 13. The screen oxide 13 surrounds areas of the silicon substrate 3, the gate oxide layer 5, the thin gate layer 9, the thick gate layer 7, the dielectric layer 25, the thin gate layer 29, and the thick gate layer 27. The screen oxide 13 protects the gate stack 40 and the surrounding areas of the gate stack 40 from impurities and damage caused by subsequent ion implantation and other processes. These processes include formation of the source and drain for the gate stack 40. With respect to the floating gate 17, the nitrogen in-situ doped thick gate layer 7 reduces thickening of the tunneling oxide layer 5 during the application of the screen oxide 13. The thin gate layer 9 affords a floating gate and tunneling oxide interface for the floating gate 17 that preserve device characteristics of the polysilicon, amorphous silicon, or other similar material grown in the absence of nitrogen impurities. Thus, the electrical characteristic of the gate interface is preserved while maintaining uniform tunneling oxide thickness. The uniform tunneling oxide thickness provides more consistent and reliable operations for barrier to tunneling or hot carrier injection between the source/channel/drain regions and the floating gate that are required for program and erase operations in nonvolatile memories. Additionally, the nitrogen in-situ doped gate layer 7 has physical properties of reduced grain size that provide more granules for the same gate oxide area which also increase the quality of the tunneling oxide layer 5.

With respect to control gate 37, the thick gate layer 27 having nitrogen impurities reduces thickening of the dielectric oxide layer 25 during the application of the screen oxide 13. The thin gate layer 29 affords a control gate and dielectric oxide interface for the control gate 37 that preserve device characteristics of the polysilicon, amorphous silicon, or other similar material grown in the absence of nitrogen impurities. The nitrogen in-situ doped gate layer 27 has physical properties of reduced grain size that provide more granules for the same dielectric oxide area which also increase the quality of the dielectric oxide layer 25. Thus, a high quality control gate and gate oxide interface having reduced gate oxide oxidation are formed for consistent and reliable operating nonvolatile memory devices.

Figure 9:
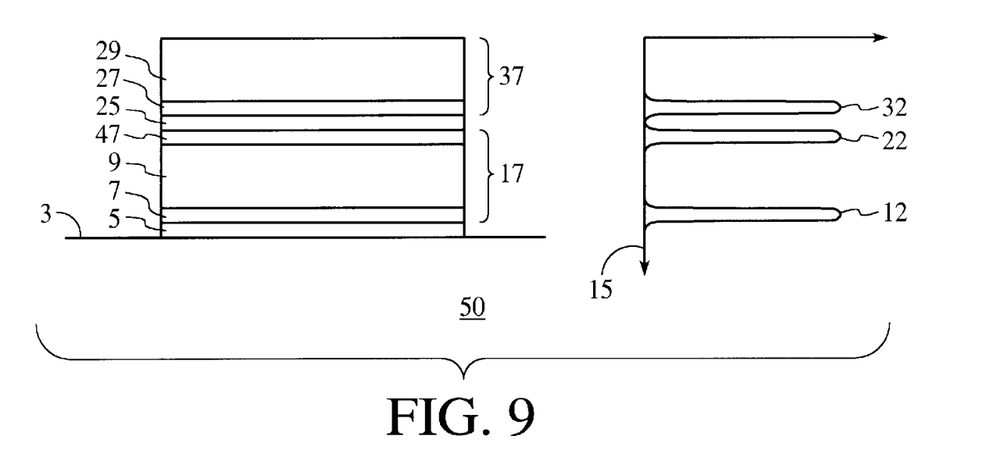
FIG. 9 is an alternative diagram of a gate stack and an accompanying graph showing nitrogen impurity concentration of the processing chamber during fabrication of the gate stack according to an embodiment of the present invention.

In another embodiment of the present invention, FIG. 9 depicts a simplified gate stack 50 for a nonvolatile memory device. The simplified gate stack 50 includes a silicon substrate 3, a tunneling oxide 5, a floating gate 17 comprising of a thin gate layer 7 and a thick gate layer 9, a nitrogen in-situ doped layer 47, a dielectric layer 25, and a control gate 37 comprising of a thin gate layer 27 and a thick gate layer 29. FIG. 7 also depicts a graph having an x-axis 11 and an y-axis 15. X-axis 11 represents impurity concentration during fabrication of the gate stack 50, and the y-axis represents the vertical location of the gate structure 50 with respect to the thin gate oxide 5, the floating gate layers 7 and 9, the nitrogen in-situ doped layer 47, the dielectric layer 25, and the control gate layers 27 and 29.

The gate stack 50 is formed on the silicon substrate 3. The first layer of the gate stack 50 is the gate oxide layer 5. The gate oxide layer 5 is formed by growing an oxide layer onto the silicon substrate 3. The thin gate layer 7 is comprised of impurities in-situ doped polysilicon, amorphous silicon, or other similar material. Impurities are introduced to the processing chamber as the thin gate layer 7 of polysilicon, amorphous silicon, or other similar material is formed over the gate oxide layer 5. Although other impurities may be used, the present embodiment introduces nitrogen impurities to the processing chamber. The nitrogen impurities are introduced in the form of $NH_3$ into the processing chamber. Nitrogen impurities may also be implanted to the thin gate layer 7. Curve 12 represents the concentration of $NH_3$ in the processing chamber as the thin gate layer 7 is formed. The thick gate layer 9 is formed in the absence of the $NH_3$ in the processing chamber. Nitrogen in-situ doped layer 47 is formed with the reintroduction of $NH_3$ to the processing chamber. Curve 22 represents the concentration of $NH_3$ in the processing chamber as the nitrogen in-situ doped layer 47 is formed. Thus, the thin gate layer 7, the thick gate layer 9, and the nitrogen in-situ doped layer 47 comprise the floating gate of the gate stack 50.

The dielectric layer 25 is grown over the floating gate 17 of the gate stack 50. The dielectric layer 25 separates the floating gate 17 and the control gate 37. The control gate 37 comprises of the thin gate layer 27 and the thick gate layer 29. The thin gate layer 27 is formed by introducing impurities to the processing chamber during the process of growing the thin gate layer 29. Although other impurities may be used, the present embodiment introduces nitrogen impurities to the processing chamber. The nitrogen impurities are introduced in the form of $NH_3$ into the processing chamber. The nitrogen impurities may also be implanted during the formation of the thin gate layer 27. Curve 32 represents the concentration of $NH_3$ in the processing chamber as the nitrogen in-situ doped thin gate layer 27 is formed. The thick gate layer 29 is formed by growing a layer of polysilicon, amorphous silicon, or other similar material over the thin gate layer 27 in the absence of the introduction of nitrogen impurities. Thus, the thin gate layer 27 and the thick layer 29 comprise the control gate of the gate stack 50.

Figure 10:
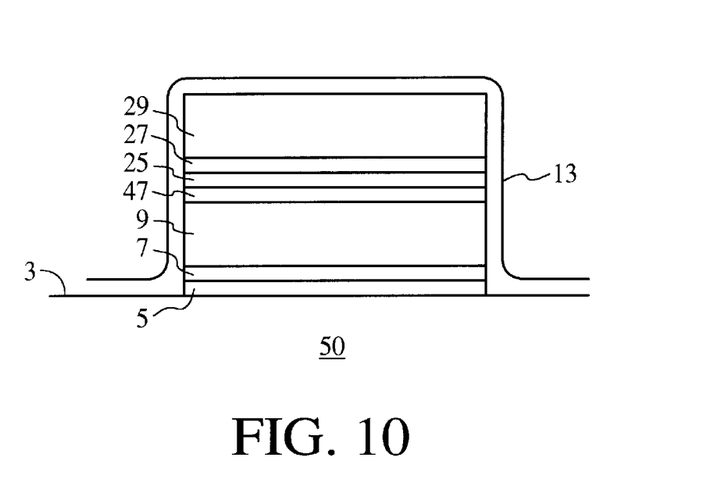
FIG. 10 is a diagram of the gate stack having a protective screen oxide in accordance with the invention.

FIG. 10 depicts the gate structure 50 with a protective screen oxide 13. The screen oxide 13 surrounds areas of the silicon substrate 3, the gate oxide layer 5, the thin gate layer 7, the thick gate layer 9, the thin gate layer 47, the dielectric layer 25, the thin gate layer 27, and the thick gate layer 29. The screen oxide 13 protects the gate structure 40 and the surrounding areas of the gate structure 40 from impurities and damage caused by subsequent ion implantation and other processes. With respect to the floating gate 17, the thin gate layer 7 having the nitrogen impurities reduces thickening of the tunneling oxide layer 5 during the application of the screen oxide 13 and affords an uniform floating gate and tunneling oxide interface. The nitrogen in-situ doped layer 47 reduces thickening of the dielectric layer 25 during the application of the screen oxide 13 and affords an uniform floating gate and dielectric layer interface. The thick gate layer 9 preserves device characteristics of the polysilicon, amorphous silicon, or other similar material grown in the absence of nitrogen impurities. Thus, a high quality floating gate and gate oxide layer interface having reduced gate oxide oxidation is formed. Additionally, the nitrogen in-situ doped gate layer 7 has physical properties of reduced grain size that provide more granules for the same gate oxide area which also increase the quality of the tunneling oxide layer 5. Forming the bulk of the floating gate without the introduction of the $NH_3$ provides a floating gate structure that retains its device characteristics without the nitrogen in-situ doped polysilicon, amorphous silicon or other similar material.

With respect to the control gate 37, the nitrogen in-situ doped thin gate layer 27 reduces encroachment of the dielectric layer 25 into the control gate 37 during the application of the screen oxide 13 and affords an uniform thickness control gate and dielectric layer interface. Given that the bulk of the control gate 37 is the thick gate layer 29, the device characteristics of the control gate 37 are dominated by the thick gate layer 29. The device characteristics of the control gate 37 are maintained by forming the thick gate layer 29 without the introduction of the NH$_3$. Thus, the impact of the thin gate layer 27 on the device characteristics of the control gate 37 is minimized. The thin gate layer 27 affords a control gate and dielectric layer interface having reduced gate oxide oxidation and uniform thickness. Additionally, the nitrogen in-situ doped gate layer 27 has physical properties of reduced grain size that provide more granules for the same gate oxide area which also increase the quality of the dielectric layer 25.

The stacked gate structure 50 having a uniform thickness floating gate 17 and control gate 37 improves the gate oxide quality of the tunneling oxide 5 and the dielectric oxide layer 25. The improved oxide quality provides increased coupling between the control gate and the floating gate for more reliable, consistent, and better performing nonvolatile memory devices.

Figure 11:
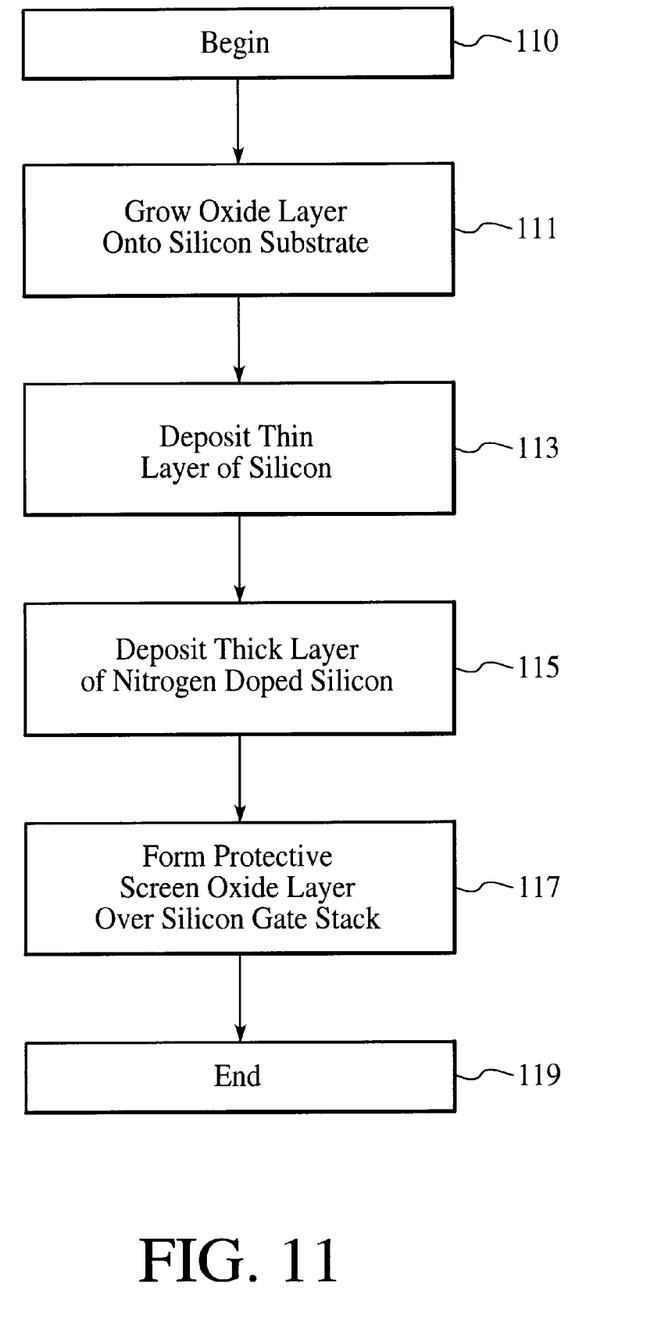
FIG. 11 is a flow diagram showing an embodiment of fabricating a gate stack in accordance with the invention.

FIG. 11 provides a flow diagram of an embodiment for growing uniform thickness silicon gate and gate oxide interfaces according to the present invention. The flow diagram begins with step 110. Step 111 grows an oxide layer onto a silicon substrate. Next, a gate is formed for the silicon gate stack. The gate is formed in two steps. The first gate step 113 deposits a thin layer of silicon over the oxide layer. The thin layer of silicon over the oxide layer preserves the electrical properties for the silicon gate and oxide interface. Next, the second gate step 115 deposits a thick layer of nitrogen in-situ doped silicon over the thin layer of silicon. The nitrogen in-situ doped silicon retards oxidation of the oxide layer with the silicon gate. Step 117 forms a protective screen oxide layer over the silicon gate stack having an uniform thickness oxide layer. The flow diagram is complete at end step 119.

Figure 12:
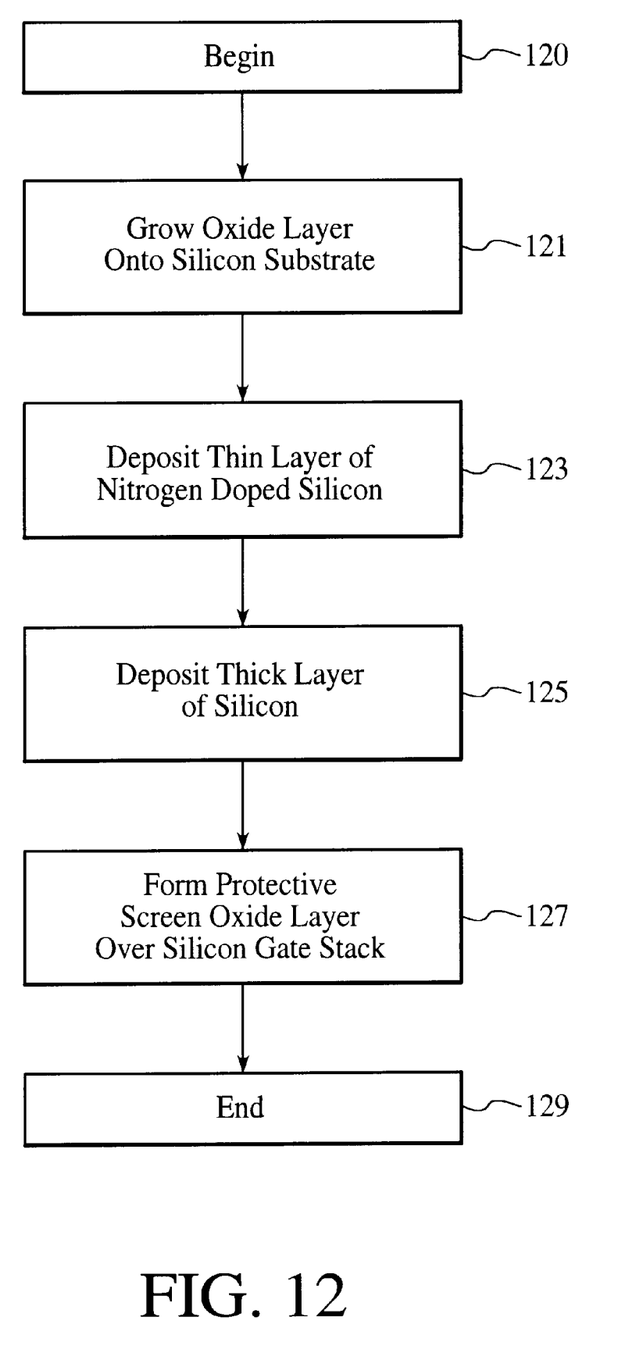
FIG. 12 is a flow diagram showing an alternative embodiment of fabricating a gate stack in accordance with the invention.

FIG. 12 provides a flow diagram of an alternative embodiment for growing uniform thickness silicon gate and gate oxide interfaces according to the present invention. The flow diagram begins with step 120. Step 121 grows an oxide layer onto a silicon substrate. Next, a gate is formed for the silicon gate stack. The gate is formed in two steps. The first gate step 123 deposits a thin layer of nitrogen in-situ doped silicon over the oxide layer. The nitrogen in-situ doped silicon retards oxidation of the oxide layer and the silicon gate. The second gate step 125 deposits a thick layer of silicon that is not nitrogen doped. Next, step 127 forms a protective screen oxide layer over the silicon gate stack having an uniform thickness oxide layer. The flow diagram is complete at end step 129.

Figure 13:
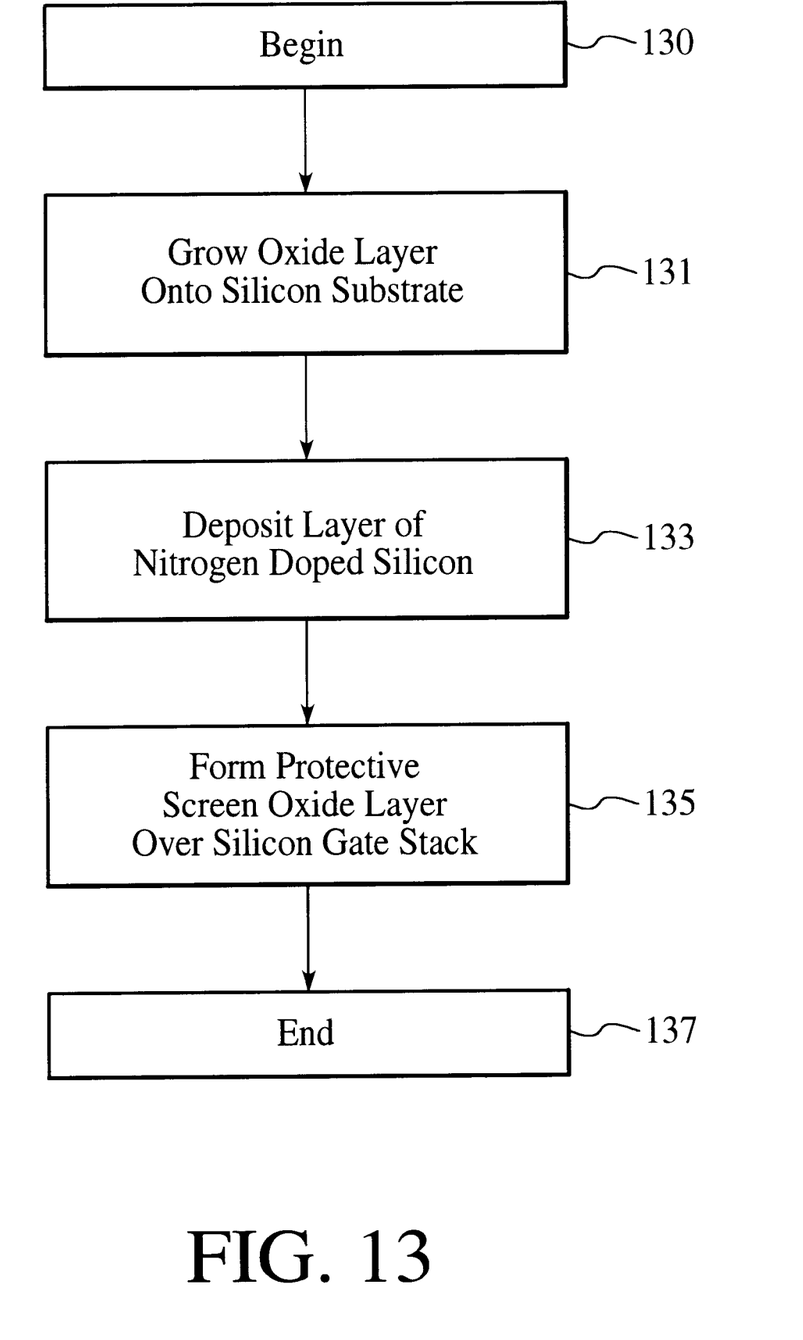
FIG. 13 is a flow diagram showing an alternative embodiment of fabricating a gate stack in accordance with the invention.

FIG. 13 provides a flow diagram of another embodiment for growing uniform thickness silicon gate and gate oxide interfaces according to the present invention. The flow diagram begins with step 130. Step 131 grows an oxide layer onto a silicon substrate. Step 133 deposits a layer of nitrogen in-situ doped silicon over the oxide layer to form the gate. In step 135, a protective screen oxide layer is formed over the silicon gate stack. The nitrogen in-situ doped silicon retards oxidation of the oxide layer and the silicon gate during the formation of the protective screen oxide layer to provide an uniform thickness oxide layer. The flow diagram is complete at end step 137.

Uniform thickness gate layer and oxide layer interfaces are formed in accordance to the embodiments of the present invention. Single gate transistors having uniform thickness gate layer and oxide layer interfaces afford devices that operate with less variations in threshold voltages and drive current requirements. The devices are also less sensitive to process conditions that cause thickening of the gate oxide.

The uniform gate oxide thickness affords nonvolatile memory device with improved program and erase operations. The formation of uniformly thick tunneling oxide more consistently controls the barrier to tunneling or hot carrier injection between the source/channel/drain regions and the floating gate. Better tunneling oxide also reduces tunneling oxide breakdown that causes the nonvolatile memory devices to fail. Thus, the uniformly thick tunneling oxide affords greater performing nonvolatile memory devices that operate with greater consistency and reliability.

The foregoing description of the preferred embodiments of the invention has been presented for purposes of illustration and description. It is intended not to be exhaustive or to limit the invention to the precise forms disclosed. Accordingly, a method for fabricating a silicon gate structure having uniform gate oxide thickness is disclosed. The uniform gate oxide structure affords MOS devices to operate with improved consistency and reliability. By retarding the oxidation of the gate oxide during processing of the MOS devices, these MOS devices are less sensitive to processing conditions that thicken the gate oxide. Obviously, many modifications and variations of the invention will be apparent to the practitioners skilled in this art. It is intended that the scope of the invention be defined by the following claims and their equivalents

What is claimed is:

1. A method of forming a silicon gate stack over a silicon substrate of a semiconductor device, the method comprising the steps of:

growing an oxide layer over the silicon substrate;

depositing a thin layer of silicon in the absence of impurities to form a thin layer of silicon over the oxide layer;

depositing a thick layer of silicon over the thin layer of silicon, the thick layer having a greater thickness than the thin layer;

introducing impurities into only the thick layer of silicon to form a silicon gate which includes the thin layer of silicon having no impurities and the thick layer of silicon having the impurities, the impurities being introduced with a concentration; and applying a protective screen oxide layer around the silicon gate stack, the impurities concentration and the thick layer thickness impeding an encroachment by the oxide layer into the silicon gate during application of the protective screen oxide layer around the silicon gate stack.

2. The method of forming the silicon gate stack according to claim 1, wherein the thin layer has physical properties including a thickness, a grain size and a number of granules per area, the thickness including a one crystalline thickness, and wherein the physical properties of the thin layer improve the quality of the oxide layer.

3. The method of forming the silicon gate stack according to claim 1, wherein the layers of silicon comprise polysilicon.

4. The method of forming the silicon gate stack according to claim 1, wherein the layers of silicon comprise amorphous silicon.

5. The method of forming the silicon gate stack according to claim 1, wherein the oxide layer comprises silicon oxide.

6. The method of forming the silicon gate stack according to claim 1 further comprises the step of growing a second oxide layer onto the thick layer of silicon.

7. A method of forming a silicon gate stack over a silicon substrate of a semiconductor device, the method comprising the steps of:

growing an oxide layer over the silicon substrate;

depositing a thin layer of silicon in the absence of impurities to form a thin layer of silicon over the oxide layer;

depositing a thick layer of silicon over the thin layer of silicon, the thick layer having a greater thickness than the thin layer;

introducing impurities into the thick layer of silicon by doping the thick layer of silicon with nitrogen or carbon, the nitrogen being introduced including in the form of an ammonia gas ($NH_3$), to form a silicon gate which includes the thin layer of silicon and the thick layer of silicon having the impurities; and applying a protective screen oxide layer around the silicon gate stack, the impurities being introduced with a concentration, the impurities concentration and the thick layer thickness impeding an encroachment by the oxide layer into the silicon gate during application of the protective screen oxide layer around the silicon gate stack.

8. A method of forming a silicon gate stack over a silicon substrate of a semiconductor device, the method comprising the steps of:

growing an oxide layer over the silicon substrate;

depositing a thin layer of silicon in the absence of impurities to form a thin layer of silicon over the oxide layer;

depositing a thick layer of silicon over the thin layer of silicon in the absence of impurities, the thick layer having a greater thickness than the thin layer;

introducing impurities into only one of the thin layer or the thick layer of silicon to form a silicon gate which includes the thin layer of silicon and the thick layer of silicon one of which having the impurities, the impurities being introduced with a concentration; and applying a protective screen oxide layer around the silicon gate stack, the impurities concentration and the thick layer thickness impeding an encroachment by the oxide layer into the silicon gate during application of the protective screen oxide layer around the silicon gate stack.

* * * * *